(12) United States Patent
Mazuré-Espejo et al.

(10) Patent No.: US 6,537,900 B2
(45) Date of Patent: Mar. 25, 2003

(54) METHOD FOR PATTERNING A METAL OR METAL SILICIDE LAYER AND A CAPACITOR STRUCTURE FABRICATED BY THE METHOD

(75) Inventors: Carlos Mazuré-Espejo, St. Nazaire les Eymes (FR); Volker Weinrich, Paris (FR); Günther Schindler, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/012,176

(22) Filed: Oct. 29, 2001

(65) Prior Publication Data

US 2002/0064914 A1 May 30, 2002

Related U.S. Application Data

(63) Continuation of application No. PCT/DE00/01303, filed on Apr. 20, 2000.

(30) Foreign Application Priority Data

Apr. 27, 1999 (DE) .......................................... 199 19 110

(51) Int. Cl.$^7$ ............................................... H01L 21/44
(52) U.S. Cl. ........................... 438/581; 438/3; 438/240; 438/686; 438/651
(58) Field of Search .................................. 438/581, 583, 438/651, 3, 240, 649, 655, 682, 686

(56) References Cited

U.S. PATENT DOCUMENTS

| | | |
|---|---|---|
| 5,366,920 A | 11/1994 | Yamamichi et al. |
| 5,401,677 A | 3/1995 | Bailey et al. |
| 5,561,307 A | 10/1996 | Mihara et al. |
| 6,171,916 B1 * | 1/2001 | Sugawara et al. ..... 257/29.267 |
| 6,274,511 B1 * | 8/2001 | Wieczorek et al. ......... 438/592 |

FOREIGN PATENT DOCUMENTS

| | | |
|---|---|---|
| DE | 195 03 641 A1 | 8/1996 |
| DE | 196 40 244 A1 | 4/1998 |
| DE | 196 40 246 A1 | 4/1998 |
| EP | 0 113 522 A2 | 7/1984 |
| EP | 0 867 926 A1 | 9/1998 |
| JP | 63 042 164 | 2/1988 |

OTHER PUBLICATIONS

Widmann, D. et al.: "Technologie hochintegrierter Schaltungen" [technology of highly integrated circuits], 2$^{nd}$ ed., Springer Verlag, Berlin, 1996, pp. 80–87.
Hönlein, W.: "Neue Dielektrika für Gbit–Speicherchips" [new dielectrics for Gbit memory chips], Phys. Bl., vol. 55, 1999, pp. 51–53.
Mantl, S.: "Silicid–Mikrostrukturen durch locale Oxidation" [silicide microstructures through local oxidation], Phys. Bl., vol. 51, 1995, No. 10, pp. 951–953.
Wolf, S.: "Silicon Processing for the VLSI Era", vol. 2, Sunset Beach, CA, USA, 1990, pp. 118–120.

* cited by examiner

Primary Examiner—Tuan H. Nguyen
(74) Attorney, Agent, or Firm—Laurence A. Greenberg; Werner H. Stemer; Ralph E. Locher

(57) ABSTRACT

In a method for fabricating a high-epsilon dielectric/ferroelectric capacitor, a patterning layer with a central base layer zone and a Si-filled trench laterally surrounding the latter is produced. Above that, a metal layer is deposited and is silicided above the Si-filled trench. Through oxidation of the silicided metal layer section the latter migrates into the trench and a base electrode is formed above the base layer zone.

17 Claims, 2 Drawing Sheets

METHOD FOR PATTERNING A METAL OR METAL SILICIDE LAYER AND A CAPACITOR STRUCTURE FABRICATED BY THE METHOD

CROSS-REFERENCE TO RELATED APPLICATION

This application is a continuation of copending International Application No. PCT/DE00/01303, filed Apr. 20, 2000, which designated the United States.

BACKGROUND OF THE INVENTION

Field of the Invention

The invention relates to a method for patterning a metal or metal silicide layer, and to a high-epsilon dielectric or ferroelectric capacitor in an integrated semiconductor circuit.

Conventional microelectronic memory elements (DRAMs) include a capacitor in which the information to be stored is stored in the form of a charge. Silicon oxide or silicon nitride layers having a dielectric constant of at most about 8 are usually used as a capacitor material. "Novel" capacitor materials (dielectrics or ferroelectrics) having significantly higher dielectric constants are required for reducing the size of the storage capacitor and also for fabricating non-volatile memories (FeRAMs).

A number of capacitor materials suitable for this purpose—Pb(Zr, Ti)$O_3$ [PZT], SrBi$_2$Ta$_2$O$_9$ [SBT], SrTiO$_3$ [ST] and (Ba, Sr)TiO$_3$ [BST]—are specified in the article "Neue Dielektrika für Gbit-Speicherchips" [New dielectrics for Gbit memory chips] by W. Hönlein, Phys. Bl. 55 (1999), pages 51–53.

The use of such novel high-epsilon dielectrics/ferroelectrics gives rise to the difficulty that Si, the traditional electrode material, can no longer be used since it is not compatible with the oxidizing atmosphere required during the dielectric/ferroelectric deposition or heat treatment.

Appropriate electrode materials are primarily sufficiently inert metals and metal silicides. The patterning of such layers has, however, hitherto remained a largely unresolved problem since suitable etching gases for removing such layers are not known at the present time.

The article "Silicid-Mikrostrukturen durch lokale Oxidation" [Silicide microstructures by local oxidation] by S. Mantl, Phys. Bl. 51 (1995), pages 951–953, proposes patterning silicide layers by locally oxidizing the layer in order to fabricate buried interconnects and mesa structures made of metal silicide. On the other hand, a method for forming platinum silicide is disclosed e.g. in U.S. Pat. No. 5,401,677.

U.S. Patent No. U.S. Pat. No. 5,561,307 describes a ferroelectric capacitor in an integrated circuit, whose base electrode is formed from a Pt layer by means of an RIE (Reactive Ion Etching) process. However, the RIE process exhibits an unsatisfactory selectivity with respect to mask materials and Pt substrates and does not allow the fabrication of a base electrode with a well-defined edge profile.

Published European Patent Application EP 0 867 926 A1 describes a method for fabricating a capacitor electrode made of a platinum-group metal. In this method, a metal layer is applied to a substrate partly made of a:Si and partly made of tungsten nitride and is silicided in a subsequent heat treatment step. The silicided layer sections are removed, with the result that an electrode made of platinum remains above the tungsten nitride layer region.

Published German Patent Application DE 195 03 641 A1 describes a method for patterning a metal silicide layer in which an Si$_3$N$_4$ mask covering the metal silicide layer is used for predetermining the structure. The substrate is unpatterned Si.

SUMMARY OF THE INVENTION

It is accordingly an object of the invention to provide a high-epsilon dielectric or ferroelectric capacitor structure having a metal or metal silicide electrode, and a method for patterning a metal or metal silicide layer which overcomes the above-mentioned disadvantages of the prior art apparatus and methods of this general type. In particular, it is an object of the invention to provide a method for patterning a metal or metal silicide layer that enables, in a technologically simple manner, the fabrication of a high-epsilon dielectric or ferroelectric capacitor with a metal or metal silicide electrode in an integrated circuit. Furthermore, it is an object of the invention to fabricate a high-epsilon dielectric or ferroelectric capacitor structure having a metal or metal silicide electrode with a well-defined edge profile.

With the foregoing and other objects in view there is provided, in accordance with the invention, a method for patterning a metal layer, which includes steps of: providing a substrate; above the substrate, producing a patterning layer for structuring a structuring pattern; producing the patterning layer with a base layer zone and a sinking layer zone laterally surrounding the base layer zone, the base layer zone having a contour; depositing a metal layer onto the patterning layer; siliciding the metal layer, at least in a region of the metal layer lying on the sinking layer zone such that a metal silicide layer section is formed in the region; and performing an oxidation step such that the metal silicide layer section migrates into the sinking layer zone of the patterning layer and a metal region having a contour that is identical to the contour of the base layer zone remains on the base layer zone.

With the foregoing and other objects in view there is also provided, in accordance with the invention, a method for patterning a metal silicide layer, which includes steps of: providing a substrate; above the substrate, producing a patterning layer for structuring a structuring pattern; producing the patterning layer with a base layer zone and a sinking layer zone laterally surrounding the base layer zone, the base layer zone having a contour; producing a metal silicide layer on the patterning layer; performing an oxidation step to oxidize the metal silicide layer at least in a section of the metal silicide layer in the sinking layer zone where the metal silicide layer migrates into the sinking layer zone; and during the oxidation step, a region of the metal silicide layer having a contour identical to the contour of the base layer zone remains on the base layer zone.

In general, the invention is based on burying, below an oxide, undesired regions of the unpatterned metal or metal silicide layer from which e.g. a base electrode for a capacitor is intended to be formed, instead of removing them in the hitherto customary manner by means of chemical or physical processes.

For this purpose, according to the invention, first a patterning layer with a pattern (prepatterned base layer zone) of the patterned metal layer to be formed is produced. Since the patterning layer can be realized from customary layer materials that are technologically simple to handle (Si, in particular polysilicon in the sinking layer zone; for example SiO$_2$ in the base layer zone), this layer can be produced without difficulty using the customary planar-technology methods (layer deposition methods; layer patterning by lithography and etching techniques).

The prepatterned base layer zone preferably has a structure that is identical in relation to the metal layer (metal region) to be patterned. In other words, the base layer zone serves as a mask of the metal region to be formed, which is intended to be created by patterning the metal layer.

According to a first aspect of the invention, a metal layer is deposited above the patterning layer. The undesired regions of the metal layer which lie laterally outside the base layer zone are silicided and subsequently "sunk" in the patterning layer by oxidation.

In this way, it is possible to form a patterned metal layer which includes metal to the greatest possible extent over the whole area and serves as an electrode, metallization layer or interconnect.

In particular, the patterned metal layer includes a patterned metal region which is essentially of the same structure in relation to the base layer zone, i.e. the outer contour of the base layer zone corresponds to the contour of the patterned metal region. In this case, in contrast to the lateral, sunk metal silicide layer section, the metal region produced is not altered in terms of its position, but can also be partially or completely silicided.

When a metal layer is deposited, it is also possible, however, to produce a patterned metal region which includes metal silicide over part of or the whole area. In this case, regions above the base layer zone (i.e. within the base electrode contour) are also silicided, but care then has to be taken to ensure that these silicided regions are not oxidized and thus likewise "sunk".

The electrical contact-connection of the patterned metal region to be produced is preferably formed by an electrical connection structure made of Si, in particular polysilicon, which is provided in the base layer zone. In this case, between the connection structure and the metal layer, an electrically conductive barrier layer is expediently deposited in order to afford protection against siliciding of the metal layer by the connection structure and also in order to afford protection of the connection structure against oxidation. This makes it possible, even when an Si connection structure is provided, to produce a metal region including metal over the whole area, e.g. in the form of a base electrode. Furthermore, the patterned metal region can also subsequently be contact-connected by, for example, a contact structure introduced in an insulation layer covering the metal region.

Preferably, on the deposited metal layer in the region above the base layer zone and at least where siliciding of the metal layer is later provided, an oxidation mask is produced in order to afford protection against oxidation of such silicided metal layer regions. This reliably precludes oxidation and "sinking" of silicided metal regions within the base electrode contour.

The sinking layer zone of the patterning layer is preferably made at least twice as thick as the metal layer. The sinking layer zone then has a depth large enough to ensure that the electrical and mechanical contact between the positionally fixed metal region above the base layer zone and the adjacent, lowered metal silicide layer section reliably breaks off.

According to a second aspect of the invention, a metal silicide layer is produced on the patterning layer.

On account of the siliciding that is already prescribed in this case, all that is required for the patterning of the metal silicide layer is oxidation of the undesired outer layer regions. A metal silicide region (e.g. base electrode of a capacitor) is formed which consists of metal silicide to the greatest possible extent over the whole area.

Since, in this case, in contrast to the first aspect of the invention, siliciding of a metal layer with a corresponding increase in the thickness thereof does not take place, it suffices for the sinking layer zone of the patterning layer to be thicker than the metal silicide layer. In particular, it may be about twice as thick as the metal silicide layer.

In accordance with an added feature of the invention, in either embodiment or aspect of the invention, an oxide layer formed during the oxidation in the sinking layer zone above the sunk metal silicide layer section is removed at least in a sidewall region of the metal or metal silicide region. This makes it possible also to utilize the uncovered sidewall region for construction e.g. of a capacitor. As a result, the effective area (i.e. the area which can be brought into contact with the high-epsilon dielectric or ferroelectric) of the base electrode and thus the capacitance of the capacitor can be increased considerably, if appropriate. Assuming an adequate layer thickness of the metal or metal silicide layer, it is possible to produce capacitors whose vertical base electrical area exceeds the horizontal base electrode area.

The abovementioned utilization of the vertical dimension, the positionally accurate and contour-defined transfer (made possible by the invention) of the zone structure of the patterning layer to the metal or metal silicide, and the capacitance-increasing effect brought about by using a high-epsilon dielectric or ferroelectric contribute to a significant reduction in the space requirement of the capacitor in the integrated circuit. Consequently, it is possible to obtain higher integration densities of memory elements, for example.

Other features which are considered as characteristic for the invention are set forth in the appended claims.

Although the invention is illustrated and described herein as embodied in a method for patterning a metal or metal silicide layer, and a capacitor fabricated by this method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
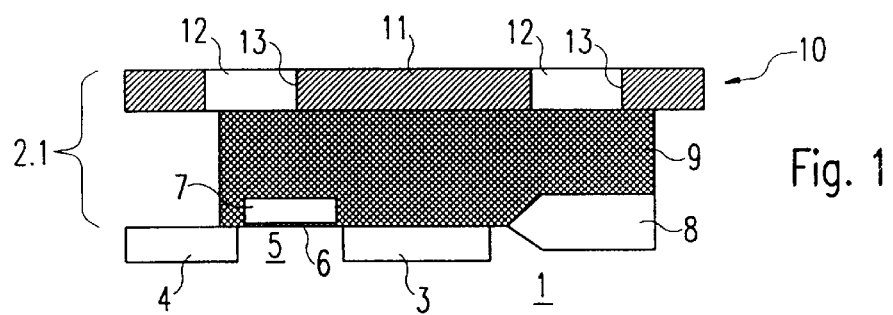
FIG. 1 shows a semiconductor layer sequence used to fabricate a first exemplary embodiment of a capacitor.

Referring now to the figures of the drawing in detail and first, particularly, to FIG. 1 thereof, there is shown a diagrammatic partial sectional view through an Si semiconductor 1 (wafer), above which a layer sequence 2.1 is constructed. The Si semiconductor substrate 1 may be p-doped, for example. An n⁺-doped drain region 3 is formed in the semiconductor substrate 1 and is isolated from an n⁺-doped source region 4 by means of an interposed channel 5 made of substrate material.

Above the channel 5 there is a thin gate oxide layer 6. A polysilicon gate electrode 7 is provided on the gate oxide layer 6. A field oxide 8, usually realized using the LOCOS technique (Local Oxidation of Silicon), spaces apart the N-channel MOS transistor 3, 4, 5, 6, 7 from an adjacent transistor (not illustrated).

Instead of the transistor 3, 4, 5, 6, 7, it is also possible to realize a different monolithic semiconductor functional element (e.g. a bipolar transistor) in/on the semiconductor substrate 1. The fabrication of such semiconductor structures is known and is not, therefore, explained in more detail below.

Situated above the Si semiconductor substrate 1 is a covering oxide layer 9, which forms the substrate 9 in this exemplary embodiment. A patterning layer 10 is arranged on the covering oxide layer. The patterning layer 10 has a base layer zone 11 arranged vertically above the drain region 3, and a sinking layer zone 12 laterally surrounding the base layer zone 11.

The base layer zone 11 usually is made of silicon dioxide and the sinking layer zone 12 is formed from silicon, in particular polysilicon. However, for the base layer zone 11 it is also possible to use other materials that are inert to the greatest possible extent with respect to siliciding.

The lateral dimensions of the base layer zone 11 correspond to the desired horizontal dimensions of the base electrode of the capacitor that will be produced. In other words, the zonal pattern of the patterning layer 10 is a pattern of the base electrode structure to be produced.

A process implementation for fabricating the layer sequence 2.1 is explained below by way of example. A multiplicity of alternative and/or further process steps are possible in addition to the process steps specified.

The covering oxide layer 9 is preferably deposited by means of a TEOS (Tetraethyl orthosilicate) or a PECVD (Plasma Enhanced CVD) method. Other methods, for example silane oxide method, LTO (Low Temperature Oxide) method, SAVCD (Sub-Atmospheric CVD), and HTO (High Temperature Oxide), can likewise be used, under certain circumstances.

On the covering oxide layer 9, a continuous insulation layer is deposited which later (i.e. after its patterning) forms the patterning layer 10. The insulation layer preferably likewise consists of $SiO_2$, and in this case the same layer producing methods and the same process step as in the formation of the covering oxide layer 9 can be used.

In a subsequent process step, trenches 13 for the sinking layer zones 12 are introduced into the insulation layer (or into the possibly (material)-identical covering oxide layer 9). Customary lithographic and etching methods can be used for this purpose.

The trenches 13 are then filled with polysilicon, thereby forming the sinking layer zones 12. The polysilicon is preferably deposited using a low pressure CVD method.

Afterward, the applied polysilicon layer is etched back uniformly. As an alternative or in addition to the polysilicon etching-back, a CMP (Chemical Mechanical Polishing) planarization can be carried out.

After the process steps described, the structure illustrated in FIG. 1 is present with a patterning layer 10 that is essentially planar at the surface.

Figure 2:
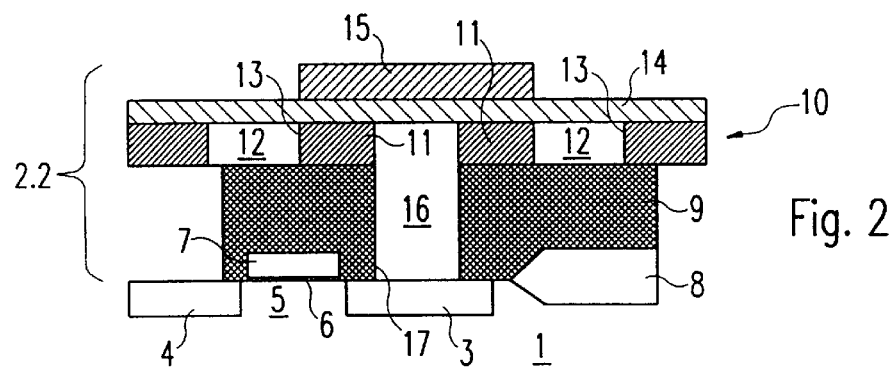
FIG. 2 shows the layer sequence shown in FIG. 1 after producing a connection structure and applying a metal layer.

FIG. 2 shows the construction of the layer sequence 2.2 at a later time in the process.

A continuous metal layer 14 made of Pt, Ir, Ru, Os, Ti, Co or another suitable electrode material is applied above the patterning layer 10. Situated above the metal layer 14 is an oxidation mask 15, which consists of $Si_3N_4$, for example, and whose peripheral contour is essentially identical to the peripheral contour of the base layer zone 11.

An electrically conductive connection structure 16 (so-called "plug"), which is composed of tungsten in the example illustrated here, penetrates through the central region of the base layer zone 11. The connection structure 16 also passes through the covering oxide layer 9 and establishes an electrical connection between the drain region 3 and the metal layer 14.

Figure 3:
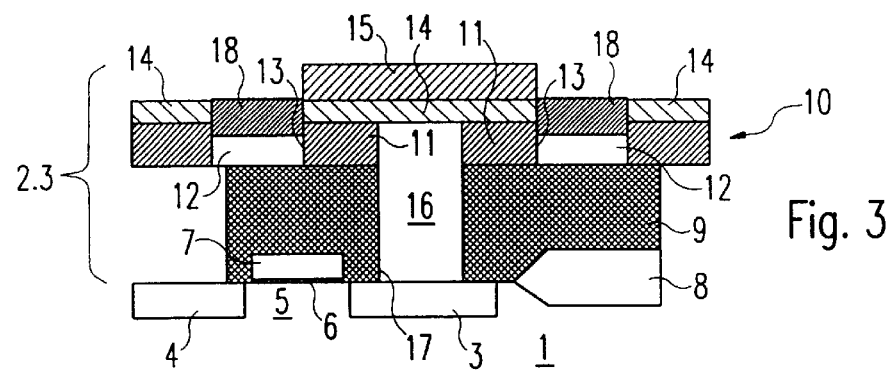
FIG. 3 shows the layer sequence shown in FIG. 2 after local siliciding of the metal layer.

The process steps for the construction of the layer sequence 2.2 shown in FIG. 2 include etching a contact hole 17 into the patterning layer 10 and into the covering oxide layer 9, filling the contact hole 17 with the material of the connection structure 16 (tungsten), performing diverse HF and/or sputtering cleaning steps for the surface of the patterning layer 10, depositing the metal layer 14, and depositing and patterning the oxidation mask 15. Afterward, the zone pattern of the patterning layer 10 is transferred to the metal layer 14 in the context of a siliciding step. The siliciding step is carried out in a protective gas atmosphere (inert gas) under the action of heat. The result achieved is that the metal layer 14 is silicided in the sections lying directly above the sinking layer zones 12 of the patterning layer 10 (see layer sequence 2.3 of FIG. 3).

Since the resulting metal silicide layer sections 18 are about twice as thick as the metal layer 14, they project into the trenches 13 on their underside.

For the case (not illustrated) of a connection structure 16 composed of polysilicon, siliciding of the metal layer 10 also takes place in the region above the connection structure 16.

Since the metal silicide (for example $CoSi_2$, $TiSi_2$, $PtSi$) has a sufficiently good electrical conductivity and can be used as an electrode material, this may be entirely acceptable or even desirable. If, however, despite a polysilicon connection structure 16, the intention is to produce a base electrode of the capacitor which consists of metal over the whole area, it is possible, in an earlier process step, to provide an electrically conductive barrier layer between the connection structure 16 and the metal layer 14, which protects the metal layer 14 against siliciding and the connection structure 16 against oxidation. The oxidation mask 15 can then be dispensed with, if appropriate.

As a rule, even in the case of a connection structure 16 made of W, a barrier layer between the connection structure 16 and the metal layer 14 is used to protect the connection structure 16 against oxidation.

The patterning of the metal layer 14 is carried out by oxidizing the metal silicide layer sections 18 in a further heat treatment step. The oxidation can be effected at about 90° C. in humid air and lasts for about 45 min.

Figure 4:
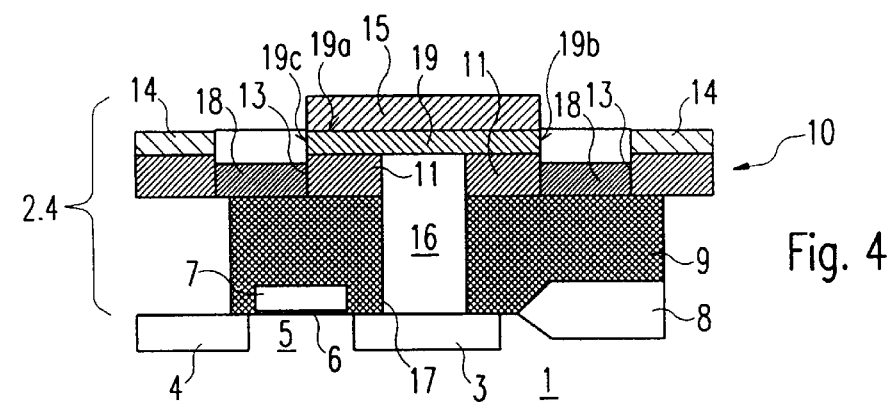
FIG. 4 shows the layer sequence shown in FIG. 3 after oxidation of the silicided metal layer sections.

During the oxidation, silicon diffuses from the sinking layer zones 12 through the metal silicide layer sections 18, and a layer of silicon dioxide forms on the metal silicide layer sections 18. The metal silicide layer sections 18 thereby migrate into the sinking layer zones 12, i.e. they "sink" in the latter. During the "sinking" of the metal silicide layer sections 18, their electrical and mechanical contact with the metal layer 14 lying above the base layer zone 11 breaks off; the base electrode 19 is thus produced in accordance with the layer sequence 2.4 shown in FIG. 4. The precise mechanism for the "sinking" of the metal silicide layer sections 18 is described in the article, already cited, by S. Mantl (Phys. Bl. 51 (1995), pp. 951–953), whose entire disclosure content is hereby incorporated by reference.

It is pointed out that the oxidation mask 15 can also be omitted in the process sequence illustrated in FIGS. 1–4, since no silicided, oxidizable metal layer regions are present above the base layer zone 11. The oxidation mask 15 is obligatory, however, if a connection structure 15 made of polysilicon without an overlying barrier layer is used.

As a result of the sinking of the metal silicide layer sections 18, at least one metal region 19 of approximately the same peripheral contour as the base layer zone 11 remains on the latter, which metal region serves as a base electrode 19 for the capacitor to be formed.

After the fabrication of the base electrode 19, isotropic $SiO_2$ etching-back can be carried out in order to uncover its sidewalls 19b, 19c, if these are also intended to be utilized as electrode areas.

In a further step, the oxidation mask 15 (if present) is removed wet- or plasma-chemically, thereby uncovering the top surface 19a of the base electrode 19.

A high-epsilon dielectric or a ferroelectric, for example PZT, SBT, ST or BST, is then deposited, in a manner that is not illustrated, above the uncovered wall regions 19, 19b, 19c. A counterelectrode is deposited, likewise in a manner that is not illustrated, above the deposited high-epsilon dielectric/ferroelectric. This counterelectrode may be composed of the same material as the base electrode 19.

Figure 5:
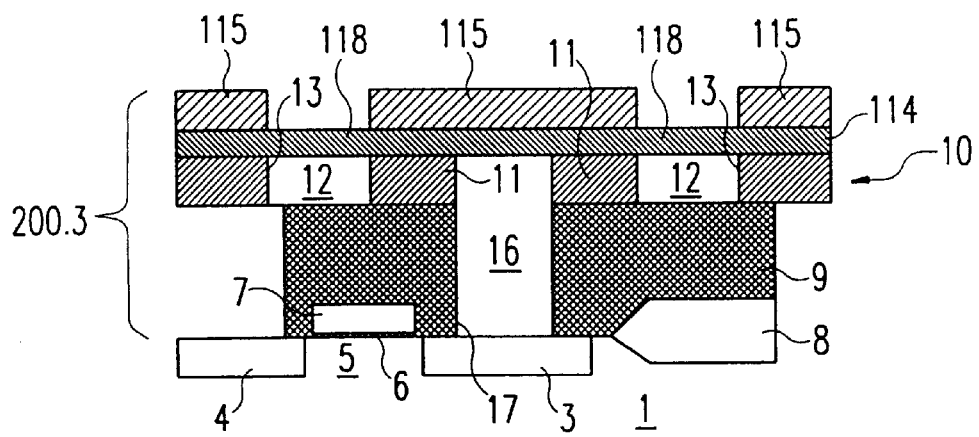
FIG. 5 shows a semiconductor layer sequence used to fabricate a second exemplary embodiment of a capacitor.

FIG. 5 shows a view of a layer sequence 200.3 of a second exemplary embodiment of the invention. Parts corresponding to the first exemplary embodiment (FIGS. 1–4) are identified by the same reference symbols. The layer sequence 200.3 differs from the layer sequence 2.3 shown in FIG. 3 essentially only by the fact that instead of a metal layer 14, a metal silicide layer 114 is applied on the patterning layer 10, and that an oxidation mask 115 (for example made of $Si_3N_4$) is provided, which completely covers the metal silicide layer 114 with the exception of the sections 118 of the metal silicide layer which lie (vertically) above the sinking layer zones 12.

The oxidation mask 115 lying (vertically) above the base layer zone 11 is obligatory if the connection structure 16 is composed of polysilicon and there is no barrier layer present between the connection structure 16 and the metal silicide layer 114. Its use is generally recommended, however, for protecting the connection structure 16.

The metal silicide layer 114 may include $CoSi_2$, $TiSi_2$, PtSi or another technologically suitable metal silicide. It can be produced, for example, by sputtering a silicide target or by layer-by-layer sputtering of metal and silicon layer portions onto the patterning layer 10 and performing a subsequent heat treatment step ("annealing").

After the application and patterning of the oxidation mask 115, an oxidation step is carried out in an oxygen or watervapor atmosphere at elevated temperature. The process parameters can be chosen as specified in the first exemplary embodiment. As already explained, a layer of silicon dioxide forms on the uncovered metal silicide layer sections 118, and the sections 118 migrate into the trenches 13.

If the layer thickness of the patterning layer 10 is thicker than the layer thickness of the metal silicide layer 114, the contact between the metal silicide layer section 118 and the rest of the metal silicide layer 114 breaks off in this case, too.

Figure 6:
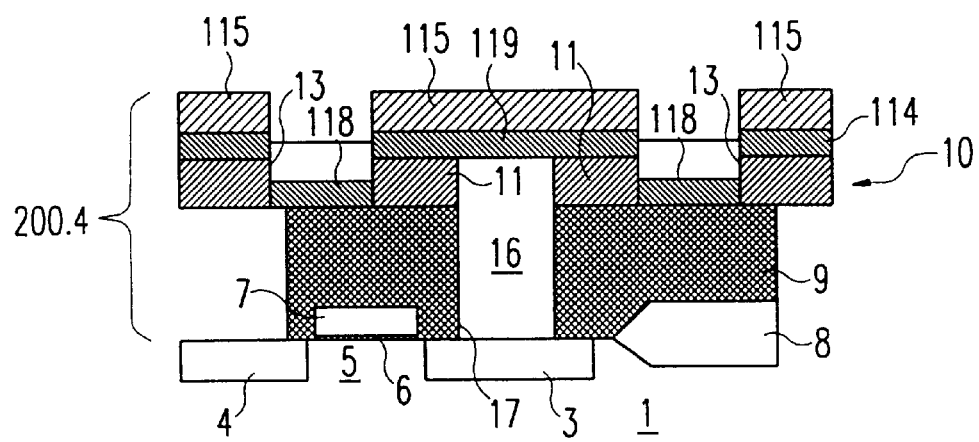
FIG. 6 shows the layer sequence shown in FIG. 5 after local oxidation of desired metal silicide layer sections.

FIG. 6 shows the structure illustrated in FIG. 5 after the completed oxidation step with "sunk" metal silicide layer sections 118 and a patterned base electrode 119 (layer sequence 200.4), which in this case constitutes the metal silicide region 119. The further processing for forming the capacitor is effected in accordance with the method sequence already described with regard to the first exemplary embodiment.

In both exemplary embodiments, the sunk metal silicide layer sections 18, 118 may, in a suitable manner, additionally be utilized as interconnects of the integrated circuit.

We claim:

1. A method for patterning a metal layer, which comprises:
    providing a substrate;
    above the substrate, producing a patterning layer for structuring a structuring pattern;
    producing the patterning layer with a base layer zone and a sinking layer zone laterally surrounding the base layer zone, the base layer zone having a contour;
    depositing a metal layer onto the patterning layer;
    siliciding the metal layer, at least in a region of the metal layer lying on the sinking layer zone such that a metal silicide layer section is formed in the region; and
    performing an oxidation step such that the metal silicide layer section migrates into the sinking layer zone of the patterning layer and a metal region having a contour that is identical to the contour of the base layer zone remains on the base layer zone.

2. The method according to claim 1, which comprises making the sinking layer zone from polysilicon.

3. The method according to claim 1, which comprises:
    forming an electrically conductive connection structure in the base layer zone; and
    forming the connection structure from a metal making contact with the metal layer.

4. The method according to claim 3, which comprises providing the metal of the connection structure as tungsten.

5. The method according to claim 1, which comprises:
    forming an electrically conductive connection structure in the base layer zone;
    forming the connection structure from a metal making contact with the metal layer;
    depositing an electrically conductive barrier layer between the connection structure and the metal region to protect against siliciding of the metal region caused by the connection structure and to protect against oxidation of the connection structure.

6. The method according to claim 1, which comprises:
    before siliciding the metal layer, producing an oxidation mask on the metal layer in a region above the base layer zone and at least in regions where the metal layer is subsequently silicided; and
    providing the oxidation mask to protect against oxidation of the regions that are subsequently silicided.

7. The method according to claim 1, which comprises making the sinking layer zone of the patterning layer at least twice as thick as the metal layer.

8. The method according to claim 1, which comprises making the metal layer from a material selected from the group consisting of platinum and iridium.

9. A method for patterning a metal silicide layer, which comprises:

providing a substrate;

above the substrate, producing a patterning layer for structuring a structuring pattern;

producing the patterning layer with a base layer zone and a sinking layer zone laterally surrounding the base layer zone, the base layer zone having a contour;

producing a metal silicide layer on the patterning layer;

performing an oxidation step to oxidize the metal silicide layer at least in a section of the metal silicide layer in the sinking layer zone where the metal silicide layer migrates into the sinking layer zone; and during the oxidation step, a region of the metal silicide layer having a contour identical to the contour of the base layer zone remains on the base layer zone.

10. The method according to claim 9, which comprises performing the step of producing the metal silicide layer by directly depositing metal silicide.

11. The method according to claim 10, which comprises performing the step of producing the metal silicide layer by sputtering a metal silicide target.

12. The method according to claim 9, which comprises performing the step of producing the metal silicide layer by:

alternately depositing metal layer portions and silicon layer portions; and subsequently performing a heat treatment step.

13. The method according to claim 9, which comprises depositing an oxidation mask onto the metal silicide layer in a region above the base layer zone.

14. The method according to claim 9, which comprises making the sinking layer zone thicker than the metal silicide layer.

15. The method according to claim 9, which comprises making the sinking layer zone twice as thick as the metal silicide layer.

16. The method according to claim 9, which comprises:

during the oxidation step, forming an oxide layer in the sinking layer zone above the section of the metal silicide layer in the sinking layer zone; and removing the oxide layer at least from a sidewall of the region of the metal silicide layer remaining on the base layer zone.

17. The method according to claim 9, which comprises:

depositing a metal-oxide-containing layer at least on the region of the metal silicide layer remaining on the base layer zone; and depositing the metal-oxide-containing layer as a capacitor dielectric material selected from the group consisting of a ferroelectric material and a high-epsilon dielectric material.

* * * * *